(12) United States Patent
Kim et al.

(10) Patent No.: US 10,274,796 B2
(45) Date of Patent: Apr. 30, 2019

(54) DISPLAY HAVING NARROW BEZEL

(71) Applicant: LG Display Co., Ltd., Seoul (KR)

(72) Inventors: Dosung Kim, Goyang-si (KR); Ryosuke Tani, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 5 days.

(21) Appl. No.: 15/659,898

(22) Filed: Jul. 26, 2017

(65) Prior Publication Data
US 2018/0031894 A1 Feb. 1, 2018

(30) Foreign Application Priority Data

Jul. 29, 2016 (KR) ........................ 10-2016-0097463

(51) Int. Cl.
*G02F 1/1345* (2006.01)
*H01L 27/32* (2006.01)
*G02F 1/1362* (2006.01)
*H01L 29/786* (2006.01)
*H01L 27/12* (2006.01)
(Continued)

(52) U.S. Cl.
CPC .... *G02F 1/13454* (2013.01); *G02F 1/136209* (2013.01); *G02F 1/136286* (2013.01); *H01L 27/1214* (2013.01); *H01L 27/1255* (2013.01); *H01L 27/3272* (2013.01); *H01L 29/78633* (2013.01); *G02F 1/1368* (2013.01); *G02F 1/133308* (2013.01)

(58) Field of Classification Search
CPC .......... G02F 1/13454; G02F 1/136209; G02F 1/136286; G02F 1/133308; G02F 1/1368; H01L 27/1255; H01L 27/1214; H01L 29/78633; H01L 27/3272
See application file for complete search history.

(56) References Cited

U.S. PATENT DOCUMENTS 6,320,204 B1 11/2001 Hirabayashi et al.
6,812,912 B2 11/2004 Miyajima et al.
7,038,642 B2 5/2006 Miyajima et al.
(Continued)

FOREIGN PATENT DOCUMENTS

CN 101252135 A 8/2008
JP 2001343668 A 12/2001
(Continued)

OTHER PUBLICATIONS

Extended European Search Report dated Dec. 14, 2017, issued in European Patent Application No. 17183852.7.
(Continued)

*Primary Examiner* — Andrew Sasinowski
(74) *Attorney, Agent, or Firm* — Morgan, Lewis & Bockius LLP

(57) ABSTRACT

The present disclosure relates to a display having a narrow bezel structure. A flat panel display includes a substrate including a display area and a non-display area; a pull-up thin film transistor including a first gate electrode, a first source electrode and a first drain electrode, disposed in the non-display area; and a boosting capacitor disposed between the first gate electrode and the first source electrode; wherein the boosting capacitor includes a light shielding layer connected to the first gate electrode and overlapping with the first source electrode, but not overlapping with the first drain electrode.

20 Claims, 10 Drawing Sheets

(51) Int. Cl.
*G02F 1/1333* (2006.01)
*G02F 1/1368* (2006.01)

(56) References Cited

U.S. PATENT DOCUMENTS

| | | | |
|---|---|---|---|
| 8,059,220 | B2 | 11/2011 | Oyamada |
| 8,174,633 | B2 | 5/2012 | Segawa et al. |
| 9,482,891 | B2 | 11/2016 | Sekine |
| 2002/0171086 | A1 | 11/2002 | Miyajima et al. |
| 2003/0075718 | A1* | 4/2003 | Jang ............... G02F 1/13454 257/72 |
| 2003/0202149 | A1 | 10/2003 | Miyajima et al. |
| 2007/0159565 | A1 | 7/2007 | Segawa et al. |
| 2008/0198284 | A1 | 8/2008 | Oyamada |
| 2009/0021662 | A1* | 1/2009 | Chang ............... G02F 1/1368 349/46 |
| 2010/0051957 | A1* | 3/2010 | Kim ............... G02F 1/136213 257/72 |
| 2013/0335661 | A1* | 12/2013 | Bae ............... G02F 1/133512 349/42 |
| 2015/0243238 | A1 | 8/2015 | Jung et al. |
| 2015/0277172 | A1 | 10/2015 | Sekine |
| 2016/0133655 | A1 | 5/2016 | Egami et al. |

FOREIGN PATENT DOCUMENTS

| | | |
|---|---|---|
| JP | 2002149087 A | 5/2002 |
| JP | 2002198537 A | 7/2002 |
| JP | 2003315817 A | 11/2003 |
| JP | 2005141264 A | 6/2005 |
| JP | 2007188936 A | 7/2007 |
| JP | 2008165029 A | 7/2008 |
| JP | 2011242786 A | 12/2011 |
| JP | 2015161945 A | 9/2015 |
| JP | 2015191105 A | 11/2015 |
| KR | 20160009220 A | 1/2016 |
| TW | 5757777 B | 2/2004 |
| TW | 200730983 A | 8/2007 |

OTHER PUBLICATIONS

Taiwanese Office Action dated Apr. 25, 2018 for the counterpart Taiwanese patent application No. 106125384.
Japanese Office Action dated May 31, 2018 for the counterpart Japanese patent application No. 2017-145267.

* cited by examiner

DISPLAY HAVING NARROW BEZEL

This application claims the benefit of Korea Patent Application No. 10-2016-0097463 filed on Jul. 29, 2016, which is incorporated herein by reference for all purposes as if fully set forth herein.

BACKGROUND

Technical Field

The present disclosure relates to a display having a narrow bezel structure, and more particularly, to a flat panel display having a narrow bezel structure in which a gate driving circuit is directly formed on the substrate of the display and a boosting capacitor (or boosting capacitance) is stacked with the thin film transistor for the display.

Discussion of the Related Art

Nowadays, various flat panel displays (or 'FPD') are developed for overcoming many drawbacks of the cathode ray tube (or 'CRT') which is heavy and bulky. The flat panel display devices are applied to various electric appliances including the mobile phone, the tablet personal computer, the notebook personal computer and so on.

The researches and developments for the displays are undergoing in the technology aspect and the design aspect. Recently, the needs for development in a design aspect that can appeal more to consumers are particularly emphasized. For example, the efforts to minimize the thickness (making much thinner) of the display have been steadily progressing. For another example, the techniques for narrowly forming the rim (or bezel) of the display have been actively developed. A narrow bezel technology is actively carried out in which a wider and larger image is provided to the user by minimizing the left and right edges of the display panel and maximizing the effective display area.

The display includes a gate driver for driving the gate lines of the display panel. In order to simplify the manufacturing processes and to reduce the manufacturing cost, the gate drivers are directly formed in the non-display area of the display panel using a thin film transistor technology such as a GIP (Gate driver In Panel) method or type. The gate driver formed by the GIP method is advantageous in reducing the bezel size of the display as compared with the IC type gate driver attached to the display panel in the form of IC (Integrated Circuit) chip.

The GIP type gate driver according to the related art includes a plurality of GIP elements for supplying the gate signal (or scan signal) to the gate lines and is designed as one GIP element drives one gate line. Since the number of the gate lines increases as the resolution of the display increases with a predetermined size of the display, the number of the GIP elements would be increased in the high resolution display. As the number of GIP elements increases, the non-display area having the GIP elements is inevitably increased, so that there is a limitation in reducing the size of the bezel area in the flat panel display.

SUMMARY

Accordingly, embodiments of the present disclosure are directed to a display having a narrow bezel that substantially obviates one or more of the problems due to limitations and disadvantages of the related art.

An aspect of the present disclosure is to provide a flat panel display having a narrow bezel structure in which the bezel area corresponding to the non-display area is remarkably reduced by a new structure of the GIP type gate driver.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flat panel display comprises a substrate including a display area and a non-display area; a pull-up thin film transistor including a first gate electrode, a first source electrode and a first drain electrode, disposed in the non-display area; and a boosting capacitor disposed between the first gate electrode and the first source electrode; wherein the boosting capacitor includes a light shielding layer connected to the first gate electrode and overlapping with the first source electrode, but not overlapping with the first drain electrode.

In one embodiment, the flat panel display further comprises: a buffer layer covering the light shielding layer; and a semiconductor layer including a channel area, a source area and a drain area, wherein the channel area overlaps with the light shielding layer, wherein the source area is extended from one side of the channel area and overlapped the light shielding layer, wherein the drain area is not overlapped the light shielding layer, wherein the first gate electrode is overlapped the channel layer with a gate insulating layer between the first gate electrode and the channel layer, and wherein the boosting capacitor is formed at some portions of the buffer layer between the light shielding layer as a first capacitance electrode and the source area as a second capacitance electrode.

In one embodiment, the flat panel display further comprises: an intermediate insulating layer covering the first gate electrode, wherein the first drain electrode is connected to the drain area on the intermediate insulating layer, and wherein the first source electrode is connected to the source area on the intermediate insulating layer.

In one embodiment, the flat panel display further comprises: a pull-down thin film transistor including a second gate electrode, a second source electrode and a second drain electrode, in the non-display area, wherein the second drain electrode is connected to the first source electrode.

In the flat panel display according to the present disclosure, the gate driver is directly formed on the substrate for the display when the thin film transistors in the display area are formed. The present disclosure provides a flat panel display having narrow bezel structure in which the bezel area is much narrower than the IC type driver that the IC chips for drivers are mounted on the substrate for the display. Further, a storage capacitance having a large area enough to generate the stable signal from the gate driver is disposed under the thin film transistor, so that the size of the bezel area would be much reduced. The present disclosure provides a flat panel display having a minimized bezel area and generating a stable gate driving signals.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
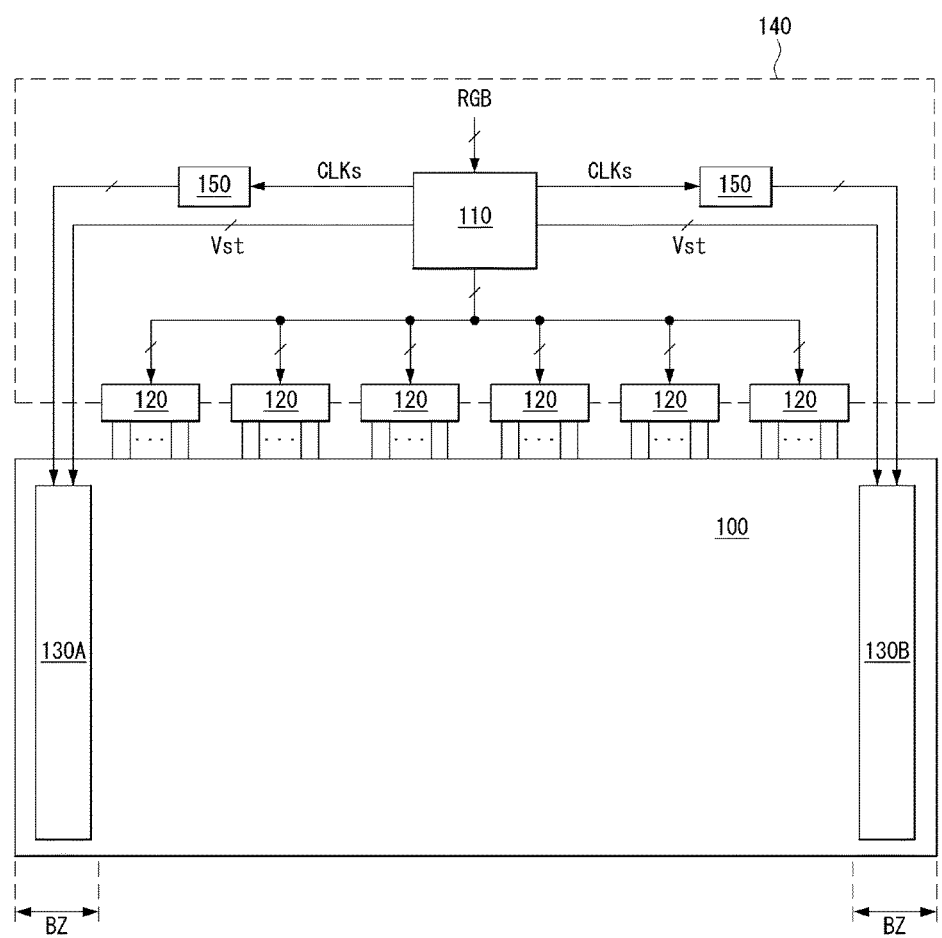
FIG. 1 is a block diagram illustrating a display according to one preferred embodiment according to the present disclosure.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names. As the terms for the elements used hereinafter are selected for convenience of the explanations, these may be different from the actual terms in the technical fields. The term of "former GIP element" means that the any one of the GIP elements previously activated on current GIP element. It is preferable that the thin film transistors of the GIP type gate driver according to the present disclosure include a low temperature polycrystalline silicon (or LTPS). The features of the present disclosure is not restricted to the LTPS, but is applied to the amorphous silicon (or a-Si:H) material and/or the oxide semiconductor material.

Hereinafter, referring to FIG. 1 we will explain about the present disclosure. FIG. 1 is a block diagram illustrating a display according to the present disclosure. Referring to FIG. 1, a flat panel display according to the present disclosure comprises a display panel 100, and a source PCB 140. The display panel 100 includes GIP type gate drivers 130A and 30B. The source PCB 140 includes a data driver, level shifter 150 and a timing controller 110.

The display panel 100 includes a plurality of data lines (not shown) and a plurality of gate lines (not shown) which are crossing each other, and a plurality of pixels (not shown) disposed in a matrix manner at each of crossing areas. The display panel 100 may be applied to a flat panel display including a liquid crystal display (or LCD), an organic light emitting diode display (or OLED) and an Electrophoresis Display (or EPD).

The data driver includes a plurality of source driver ICs 120. The source driver ICs 120 receive the digital video data RGB from the timing controller 110. The source driver ICs 120 converts the digital video data RGB to the data voltages by responding to the source timing control signal from the timing controller 110, and supplies the digital video data RGB to the data lines of the display panel 100 by synchronized to the gate output signal. The source driver ICs 120 are connected to the data lines of the display panel 100 by the COG (or Chip On Glass) process or the TAB (Tape Automated Bonding) process.

The GIP type gate driver 130A and 130B includes an odd GIP gate driver 130A and an even GIP gate driver 130B formed at the non-display area BZ of the display panel 100. For example, a plurality of odd GIP gate driver 130A including odd GIP elements for driving the odd gate lines is disposed at the left portion of the non-display area BZ. Further, a plurality of even GIP gate driver 130B including even GIP elements for driving the even gate lines is disposed at the right portion of the non-display area BZ.

The GIP type gate drivers 130A and 130B receive the gate shift clocks CLKs from the level shifter 150 embedded into the source PCB 140. The level shifter 150 coverts the TTL (or Transistor to Transistor Logic) voltage of the gate shift clocks CLKs received from the timing controller 110 into a gate high voltage level or a gate low voltage level.

The timing controller 110 receives the digital video data RGB from exterior host system through an interface such as the LVDS (or Low Voltage Differential Signaling) interface or the TMDS (or Transition Minimized Differential Signaling) interface. The timing controller 110 sends the digital video data RGB from the host system to the source driver ICs 120.

The timing controller 110 receives the timing signals including the vertical synchronizing signal, the horizontal synchronizing signal, the data enable signal and the main clock from the host system via the LVDS interface or TMDS interface. The timing controller 110 generates a data timing control signal and a gate timing control signal based on the timing signals from the host system. The data timing control signal is for controlling the operation timing of the data driver and the polarity of the data voltage. The gate timing control signal is for controlling the operation timing of the GIP type gate drivers 130A and 130B.

The gate timing control signal includes the gate start pulse, the gate shift clock CLKs, the gate output enable signal. Inputting into the first GIP element of the odd and even GIP gate drivers 130A and 130B as the start signal Vst, the gate start pulse controls the shift start timing. The other GIP elements excepting the first GIP element receive any one gate output signals of the even/odd GIP elements as the start signal. The gate output enable (or GOE) controls the output timing of the odd and even GIP gate drivers 130A and 130B.

After level shifting by the level shifter 150, the gate shift clocks CLKs are sent to the odd and even GIP gate drivers 130A and 130B and then they are used as the clock signals for shifting the start signal. The gate shift clocks CLKs include the odd gate shift clocks corresponding to the odd gate output signals and the even gate shift clocks corresponding to the even gate output signals.

The data timing control signal includes the source start pulse, the source sampling clock, the polarity control signal and the source output enable signal. The source start pulse controls the shift start timing of the source drive ICs 120. The source sampling clock is the clock signal for controlling the sampling timing of the data in the source drive ICs 120 based on the rising edge or falling edge. The polarity control signal controls the polarity of the data voltage output from the source drive ICs 120. When the mini LVDS interface is used for the data interface between the timing controller 110 and the source drive ICs 120, the source start pulse and the source sampling clock may not be included.

The GIP type gate drivers 130A and 130B according to the present disclosure can conduct the forward shift driving and the reverse shift driving. The forward shift driving means that the gate lines are sequentially driven (activated) from the output terminal of the data driver to increasingly distant direction (e.g., up to down direction in FIG. 1). The reverse shift driving means that the gate lines are sequentially driven (activated) along to the direction getting closer to the output terminal of the data driver (e.g., down to up direction in FIG. 1).

At the forward shift driving mode, the GIP type gate drivers 130A and 130B receives the forward gate start pulse and the forward gate shift clocks from the timing controller 110. At the reverse shift driving mode, the GIP type gate drivers 130A and 130B receives the reverse gate start pulse and the reverse gate shift clocks from the timing controller 110.

Figure 2:
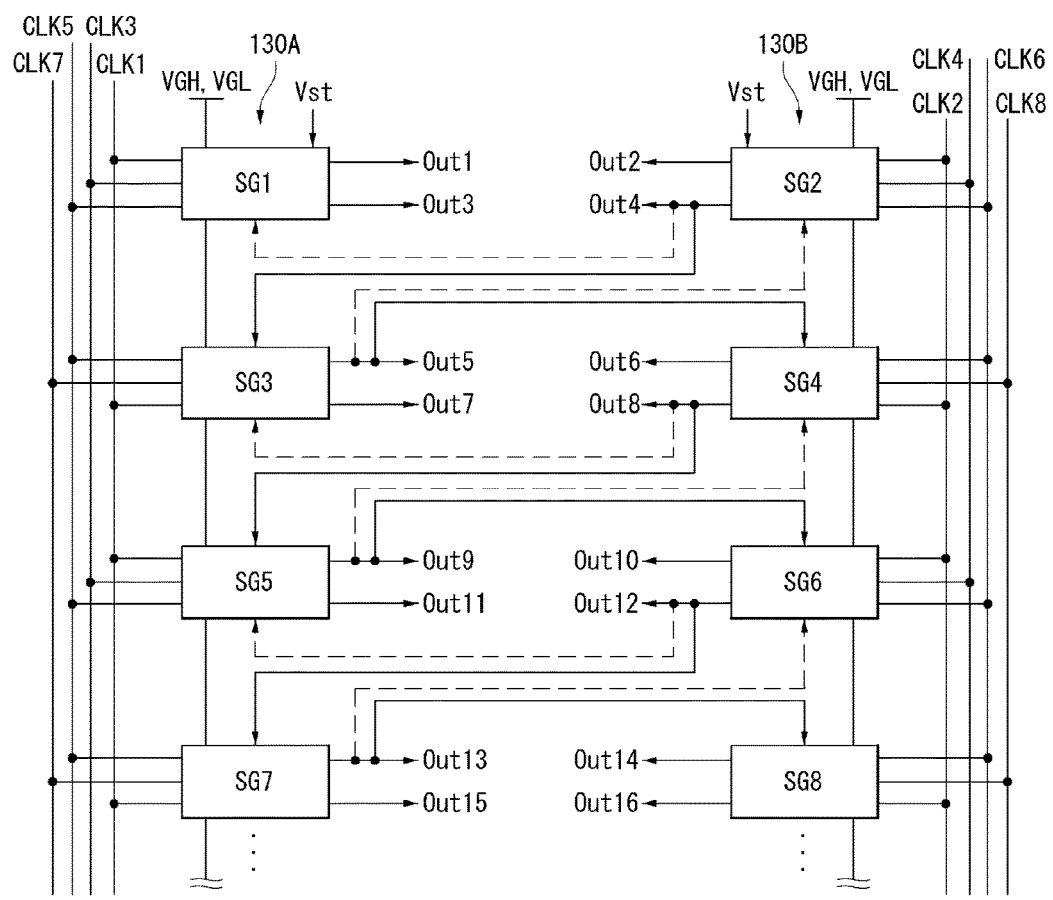
FIG. 2 is a circuit diagram illustrating a connecting configuration of the odd GIP gate driver and the even GIP gate driver shown in FIG. 1.

FIG. 2 is a circuit diagram illustrating a connecting configuration of the odd GIP gate driver and the even GIP gate driver shown in FIG. 1. The GIP type gate drivers 130A and 130B according to the present disclosure are disposed at left portion of the non-display area BZ and right portion of the non-display area BZ, respectively. Comparing with the case in which the GIP type gate drive is disposed at only any one side of the non-display area BA, the present disclosure is easy to reduce the size of the bezel.

For the narrow bezel structure, the GIP type gate drivers 130A and 130B according to the present disclosure have a structure in which the number of the GIP elements for driving the gate lines is reduced in half rather than that of the related art, so that the areas of the left and right non-display areas BZ may be minimized. To do so, each of the GIP elements included into the GIP type gate drivers 130A and 130B according to the present disclosure includes one Q node and two pull-up transistors controlling their outputs based on the electric voltage level of the Q node. The GIP element may output two different gate output signals using the Q node and two pull-up transistors.

Each of the GIP elements included into the GIP type gate drivers 130A and 130B according to the present disclosure uses any one gate output signal of the former even and odd GIP elements as the start signal, at forward shift mode or reverse shift mode. Therefore, the circuit configuration of the GIP elements may be simplified and the narrow bezel structure may be easily implemented.

Referring to FIG. 2, the odd GIP gate driver 130A according to the present disclosure includes a plurality of the odd GIP elements SG1, SG3, SG5, SG7 and so on. The odd GIP gate driver 130A generates the odd gate output signals Out1, Out3, Out5, Out7, Out9, Out11, Out13 and Out15, by shifting the start signal Vst or the gate output signal of the former even GIP element, based on the odd gate shift clocks (i.e., CLK1, CLK3, CLK5 and CLK7) among the gate shift clocks CLKs. Each of the odd GIP elements generates two odd gate output signals (i.e., Out1 and Out3, Out5 and Out7, Out9 and Out11, or Out13 and Out15) having different phases each other and supplies them to the odd gate lines. Therefore, two odd gate lines are operated by any one odd GIP element.

The even GIP gate driver 130B according to the present disclosure includes a plurality of the even GIP elements SG2, SG4, SG6, SG8 and so on. The even GIP gate driver 130B generates the even gate output signals Out2, Out4, Out6, Out8, Out10, Out12, Out14 and Out16, by shifting the start signal Vst or the gate output signal of the former odd GIP element, based on the even gate shift clocks (i.e., CLK2, CLK4, CLK6 and CLK8) among the gate shift clocks CLKs. Each of the even GIP elements generates two even gate output signals (i.e., Out2 and Out4, Out6 and Out8, Out10 and Out12, or Out14 and Out16) having different phases each other and supplies them to the even gate lines. Therefore, two even gate lines are operated by any one even GIP element.

Until now, we explained about the structures of the GIP gate drivers and the flat panel display including the same GIP gate drivers according to the present disclosure. Hereinafter, we will explain about the various structures and/or configurations of the GIP elements according to the preferred embodiments of the present disclosure.

First Embodiment

Figure 3:
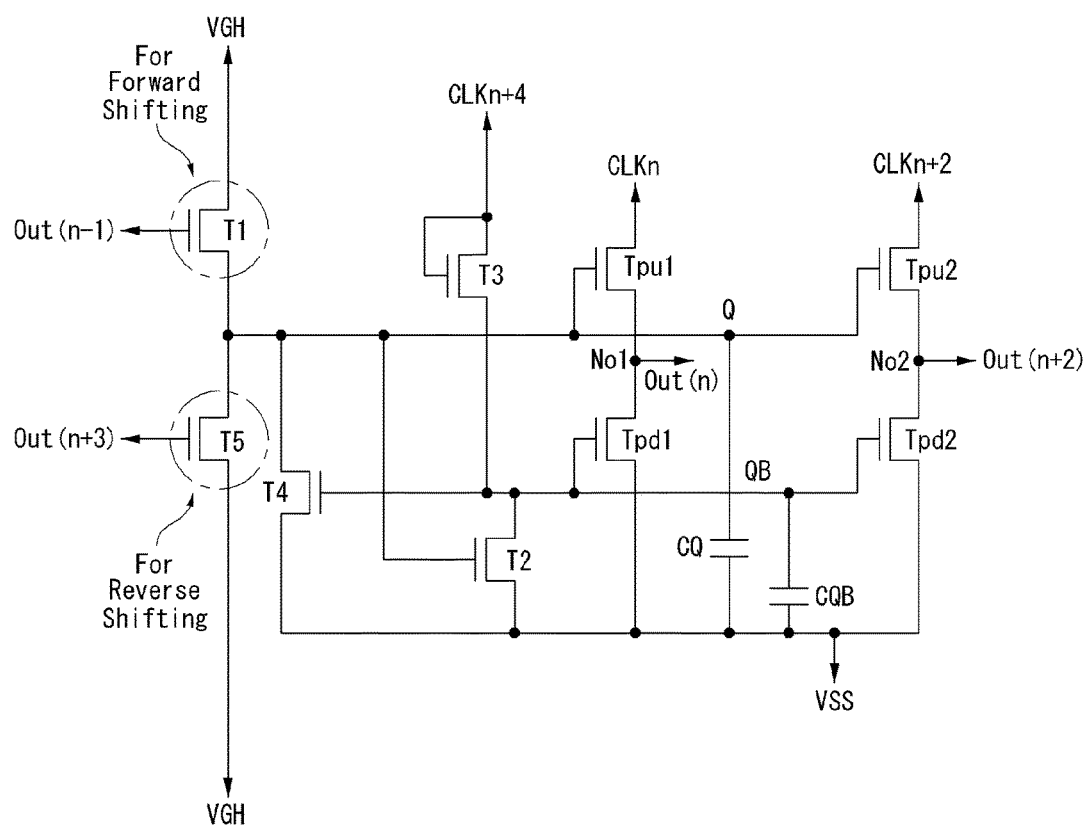
FIG. 3 is an example circuit diagram illustrating the detailed configuration of the odd GIP element or the even GIP element according to the first embodiment of the present disclosure.

Hereinafter, referring to FIGS. 3 and 4, we will explain about a GIP element according to the first embodiment of the present disclosure. FIG. 3 is an example circuit diagram illustrating the detailed configuration of the odd GIP element or the even GIP element according to the first embodiment of the present disclosure.

Referring to FIG. 3, each of the GIP elements of the GIP type gate drivers 130A and 130B according to the first embodiment of the present disclosure comprises a first pull-up thin film transistor Tpu1, a second pull-up thin film transistor Tpu2, a first pull-down thin film transistor Tpp1, a second pull-down transistor Tpd2, a first switch thin film transistor T1, a second thin film transistor T2, a third thin film transistor T3, a fourth thin film transistor T4 and a fifth thin film transistor T5. The first switch thin film transistor is for the forward shift operation, and the fifth thin film transistor is for the reverse shift operation. At the forward shift mode or the reverse shift mode, the GIP element according to the first embodiment receives the nth gate shift clock CLKn having the nth phase, the (n+2)th gate shift clock CLKn+2 having the (n+2)th phase and the (n+4)th gate shift clock CLKn+4 having the (n+4)th phase. At the forward shift mode, the GIP element according to the first embodiment receives the gate output signal Out(n−1) of the former GIP element. The former GIP element is the activated element earlier than current GIP element. At the reverse shift mode, the GIP element according to the first embodiment receives the gate output signal Out(n+3) of the former GIP element. At the reverse shift mode, the former GIP element may be disposed at the three next rows (n+3) from the current GIP element row (n).

When the first pull-up thin film transistor Tpu1 is turn on in accordance with the electric voltage of the Q node, the nth gate shift clock CLKn is applied to the first output node No1 as the nth gate output signal Out(n). To do so, the first pull-up thin film transistor Tpu1 includes a gate electrode connected to the Q node, a drain electrode connected to the input terminal of the nth gate shift clock CLKn and a source electrode connected to the first output node No1.

When the second pull-up thin film transistor Tpu2 is turn on in accordance with the electric voltage of the Q node, the (n+2)th gate shift clock CLKn+2 is applied to the second output node No2 as the (n+2)th gate output signal Out(n+2). To do so, the second pull-up thin film transistor Tpu2 includes a gate electrode connected to the Q node, a drain electrode connected to the input terminal of the (n+2)th gate shift clock CLKn+2 and a source electrode connected to the second output node No2.

When the first pull-down thin film transistor Tpd1 is turn on in accordance with the electric voltage of the QB node which reversely charged and discharged to the Q node, the electric voltage of the first output node No1 is maintained at low level voltage VSS. To do so, the first pull-down thin film transistor Tpd1 includes a gate electrode connected to the QB node, a drain electrode connected to the first output node No1 and a source electrode connected to the input terminal of the low level voltage VSS.

When the second pull-down thin film transistor Tpd2 is turn on in accordance with the electric voltage of the QB node, the electric voltage of the second output node No2 is maintained at the low level voltage VSS. To do so, the second pull-down thin film transistor Tpd2 includes a gate electrode connected to the QB node, a drain electrode connected to the second output node No2 and a source electrode connected to the input terminal of the low level voltage VSS.

At the forward shift mode in which the phase of the nth gate output signal Out(n) precedes to the phase of the (n+2)th gate output signal Out(n+2), when the first switch thin film transistor T1 is turn on in accordance with the (n−1)th gate output signal Out(n−1) received from the former GIP element, the high level voltage is applied to the Q node. To do so, the first switch thin film transistor T1 includes a gate electrode connected to the output terminal of the former GIP element, a drain electrode connected to the input terminal of the high level voltage VGH and a source electrode connected to the Q node.

When the second switch thin film transistor is turn on in accordance with the electric voltage of the Q node, the low level voltage VSS is applied to the QB node. To do so, the second switch thin film transistor T2 includes a gate electrode connected to the Q node, a drain electrode connected to the QB node and a source electrode connected to the input terminal of the low level voltage VSS.

The third switch thin film transistor T3 is configured to apply the (n+4)th gate shift clock CLKn+4 to the QB node. The third switch thin film transistor T3 includes a gate electrode and a drain electrode connected to the input terminal of the (n+4)th gate shift clock CLKn+4 and a source electrode connected to the QB node.

When the fourth switch thin film transistor T4 is turn on in accordance with the electric voltage of the QB node, the low level voltage VSS is applied to the Q node. The fourth switch thin film transistor T4 includes a gate electrode connected to the QB node, a drain electrode connected to the Q node and a source electrode connected to the input terminal of the low level voltage VSS.

At the reverse shift mode in which the phase of the (n+2)th gate output signal Out(n+2) precedes to the phase of the nth gate output signal Out(n), when the fifth switch thin film transistor T5 is turn on in accordance with the (n+3)th gate output signal Out(n+3) received from the former GIP element, the high level voltage VGH is applied to the Q node. To do so, the fifth switch thin film transistor T5 includes a gate electrode connected to the output terminal of the former GIP element, a drain electrode connected to the input terminal of the high level voltage VGH and a source electrode connected to the Q node.

The GIP element according to the present disclosure may further include a CQ capacitor CQ for ensuring the stable electric voltage level of the Q node, and a CQB capacitor CQB for ensuring the stable electric voltage level of the QB node. The CQ capacitor CQ is connected between the Q node and the input terminal of the low level voltage VSS. The CQB capacitor is connected between the QB node and the input terminal of the low level voltage VSS.

Figure 4:
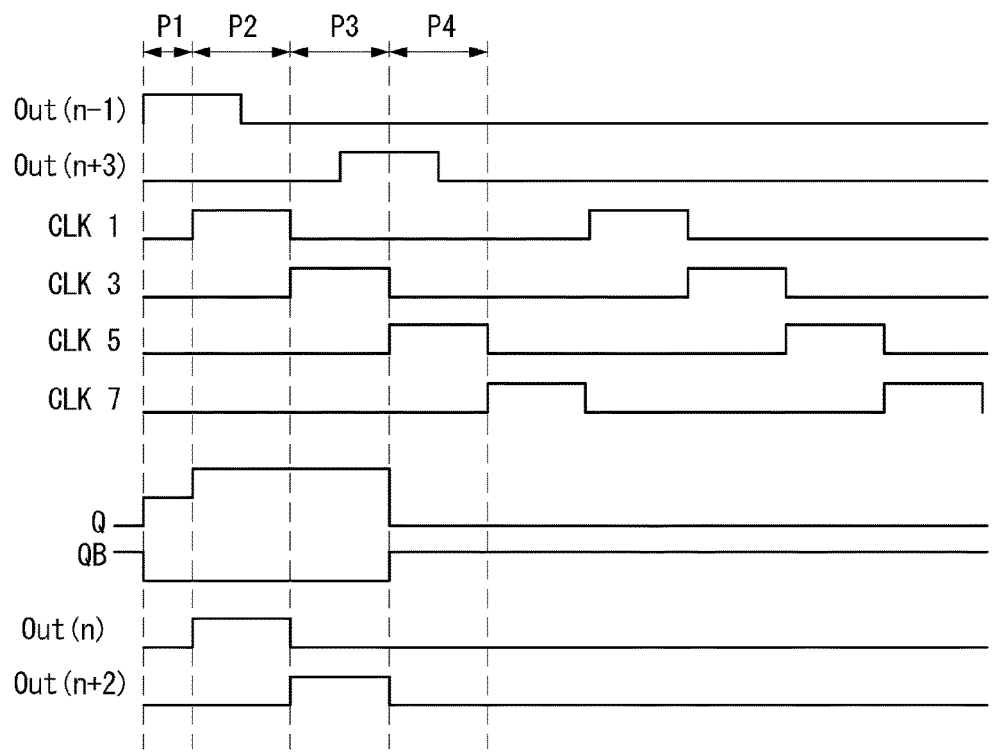
FIG. 4 is signal wave forms explaining the operating sequences of the GIP element shown in FIG. 3 according to the present disclosure.

FIG. 4 is signal wave forms explaining the operating sequences of the GIP element shown in FIG. 3 according to the present disclosure. FIG. 4 shows an example of the operation of the odd GIP element at the forward shift mode. Because of the similarity, the operation of the even GIP element at the forward shift mode is not explained, for convenience.

Referring to FIGS. 3 and 4, during the first period P1, when the first switch thin film transistor T1 is turn on in accordance with the (n−1) gate output signal Out(n−1) received from the former GIP element, the first high level voltage VGH is applied to the Q node. Then the Q node is activated. At this time, when the first switch thin film transistor T2 is turn on in accordance with the voltage of the Q node, the low level voltage VSS is applied to the QB node. Then the QB node is inactivated.

During the second period P2, when the nth gate shift clock CLKn (i.e., CLK1) is applied to the drain electrode of the first pull-up thin film transistor Tpu1, the gate level of the first pull-up thin film transistor Tpu1, the Q node level, would be bootstrapped by the coupling effect of the parasitic capacitance between the gate electrode and the drain electrode of the first pull-up thin film transistor Tpu1. As the results, the first pull-up thin film transistor Tpu1 is turn on and then the nth gate shift clock CLKn is output to the first output node No1 as the nth gate output signal Out(n). This nth gate output signal Out(n) is supplied to the nth odd gate line.

During the third period P3, when the (n+2)th gate shift clock CLKn+2 (i.e., CLK3) is applied to the drain electrode of the second pull-up thin film transistor Tpu2, the gate level of the second pull-up thin film transistor Tpu2, the Q node level, would be still in the bootstrapped condition by the coupling effect of the parasitic capacitance between the gate electrode and the drain electrode of the second pull-up thin film transistor Tpu2. As the results, the second pull-up thin film transistor Tpu2 is turn on and then the (n+2)th gate shift clock CLKn+2 is output to the second output node No2 as the (n+2)th gate output signal Out(n+2). This (n+2)th gate output signal Out(n+2) is supplied to the (n+2)th odd gate line.

During the fourth period P4, the (n+4) gate shift clock CLKn+4 is applied to the QB node via the third switch thin film transistor T3. Then, QB node is activated. In accordance with the activated level of the QB node, the first and the second pull-down thin film transistors Tpd1 and Tpd2 are turn on. Then, the low level voltage VSS is applied to the first output node No1 and the second output node No2. At the same time, in accordance with the activated level of the QB node, the fourth switch thin film transistor T4 is turn on. Then, the Q node has the low level voltage VSS.

The electric voltages of the Q node and the QB node are maintained by the CQ capacitor CQ and the CQB capacitor CQB, respectively. As the results, during a predetermined period (i.e., 1 frame period) including the fourth period P4, the electric levels of the first output node No1 and the second output node No2 are kept in the low level voltage VSS. The low level voltage VSS is applied to the nth and (n+2)th odd gate lines.

Second Embodiment

Figure 5:
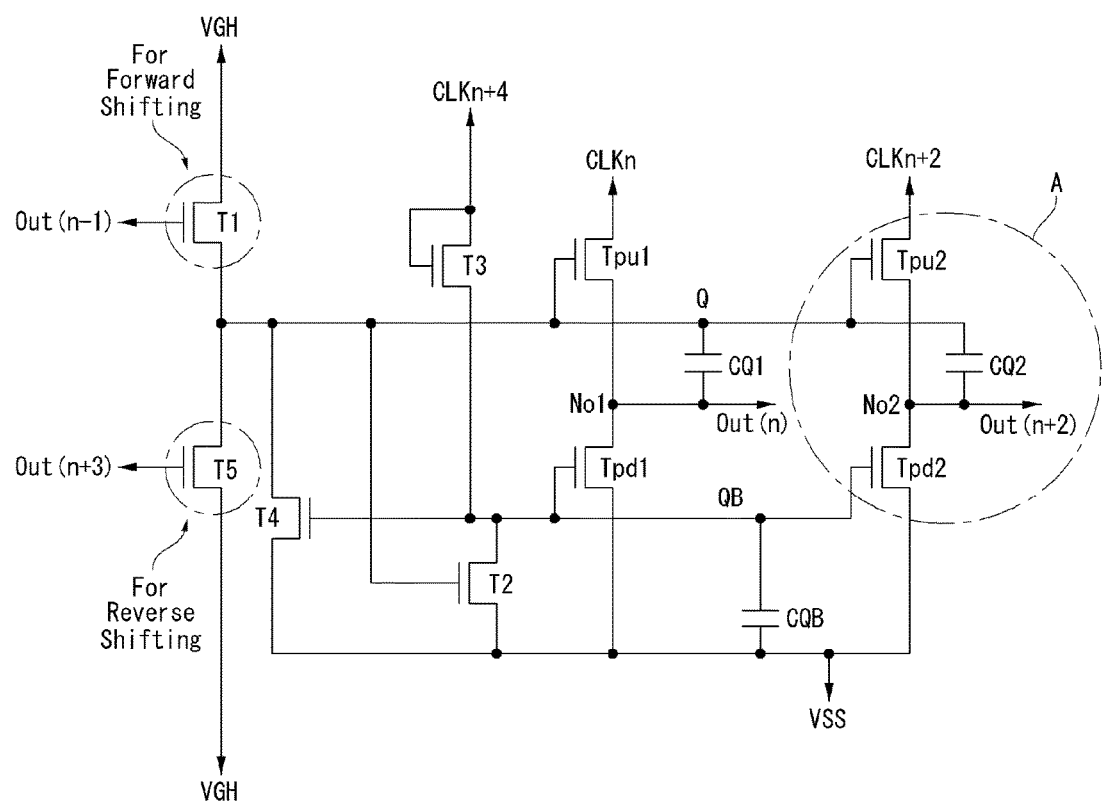
FIG. 5 is another example circuit diagram illustrating the detailed configuration of the odd GIP or the even GIP according to the second embodiment of the present disclosure.
Figure 6:
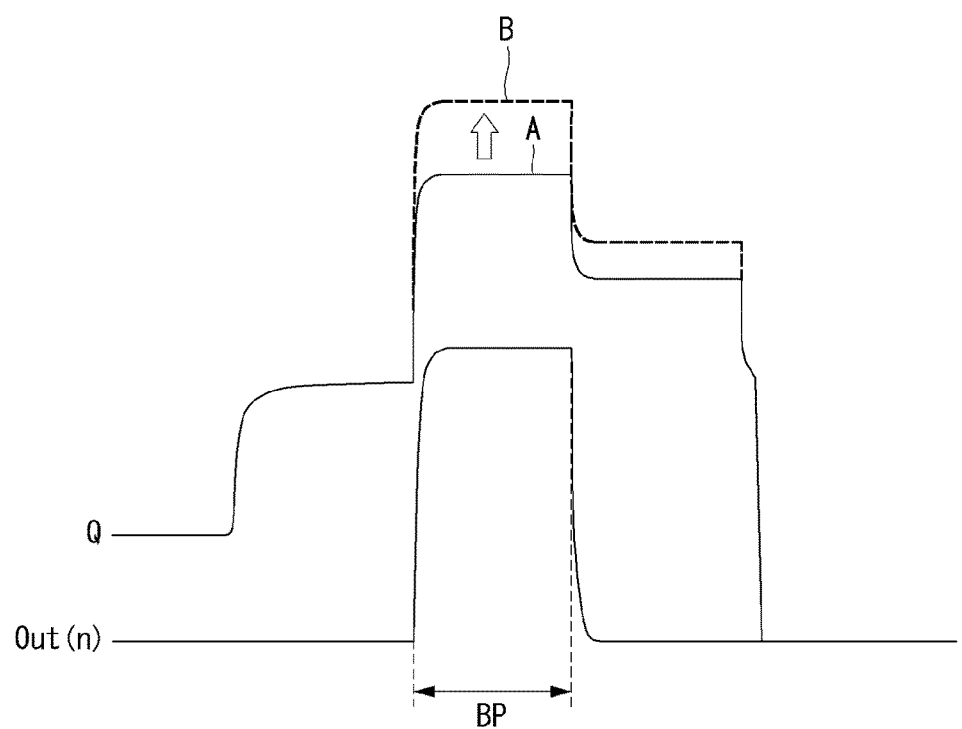
FIG. 6 is a graph comparing the electric level at the Q node according to the first embodiment and the electric level at the Q node according to the second embodiment.

Hereinafter, referring to FIGS. 5 and 6, we will explain about the GIP element according to the second embodiment of the present disclosure. FIG. 5 is another example circuit diagram illustrating the detailed configuration of the odd GIP or the even GIP according to the second embodiment of the present disclosure. Comparing with FIG. 3, the GIP element shown in FIG. 5 has a feature on the connection configuration of the CQ capacitor, and other configurations are same. Therefore, the operation sequences of the GIP element shown in FIG. 5 would be explained with those of FIG. 4. The same configurations of the GIP element shown in FIG. 5, with the FIG. 3 will not be explained again. FIG. 6 is a graph comparing the electric level at the Q node according to the first embodiment and the electric level at the Q node according to the second embodiment.

The GIP element shown in FIG. 3 has the CQ capacitor CQ connected between the Q node and the input terminal of the low level voltage VSS. The GIP element shown in FIG. 5 includes a first CQ capacitor CQ1 and a second CQ capacitor CQ2. The first CQ capacitor CQ1 is connected between the Q node and the first output node No1. The second CQ capacitor CQ2 is connected between the Q node and the second output node No2. In the view point of the second pull-up thin film transistor Tpu2, the second CQ capacitor CQ2 is connected between the gate electrode and the source electrode of the second pull-up thin film transistor Tpu2.

In the case that the CQ capacitor CQ is configured to connected to the input terminal of the low level voltage VSS, the electric voltage level of the Q node may be lowered by the coupling effect with the low level voltage VSS. In that case, even though the bootstrapping is performed, the electric voltage level of the Q node is not enough high level. As the results, the period for charging the gate shift clock to the output node for generating the gate output signal, e.g., the second period P2 and/or the third period P3 in FIG. 4, may be longer. As the charging period of the gate shift clock is closely related to the response characteristics of the GIP element, the shorter charging period of the gate shift clock is proper to ensure the rapid response of the response characteristics of the GIP element.

In the case that the first CQ capacitor CQ1 and the second CQ capacitor CQ2 are configured to connected to the first output node and the second output node, respectively, the Q node is coupled to the output node having higher electric voltage level than the low level voltage VSS when bootstrapping. Therefore, the electric voltage level B of the Q node of FIG. 5 has higher than the electric voltage level A of the Q node of FIG. 3, as shown in FIG. 6. As the results, for the GIP element as shown in FIG. 5, it is easy to be shorten the charging period (or boosting period) BP (i.e., P2 and P3 of FIG. 4) of the gate shift clock to the output node for generating the gate output signal. The response characteristics of the GIP element would be effectively enhanced.

Figure 7:
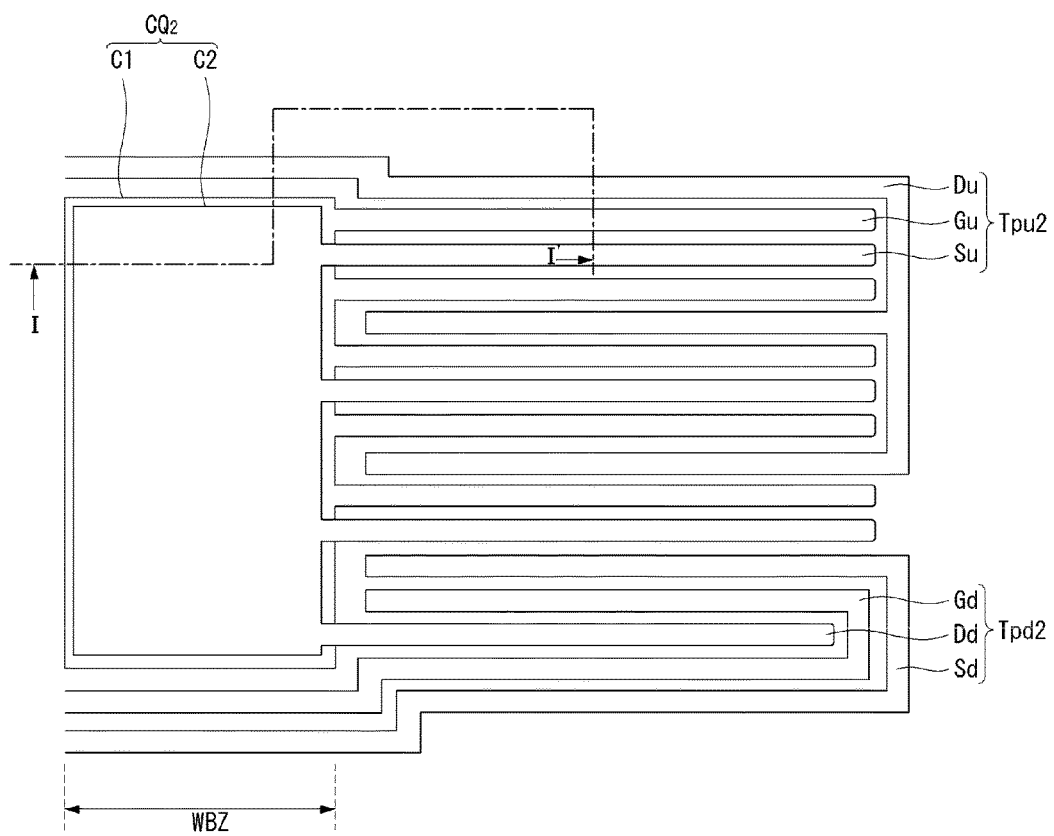
FIG. 7 is an enlarged plane view illustrating one portion of the bezel area having the GIP according to the second embodiment of the present disclosure.
Figure 8:
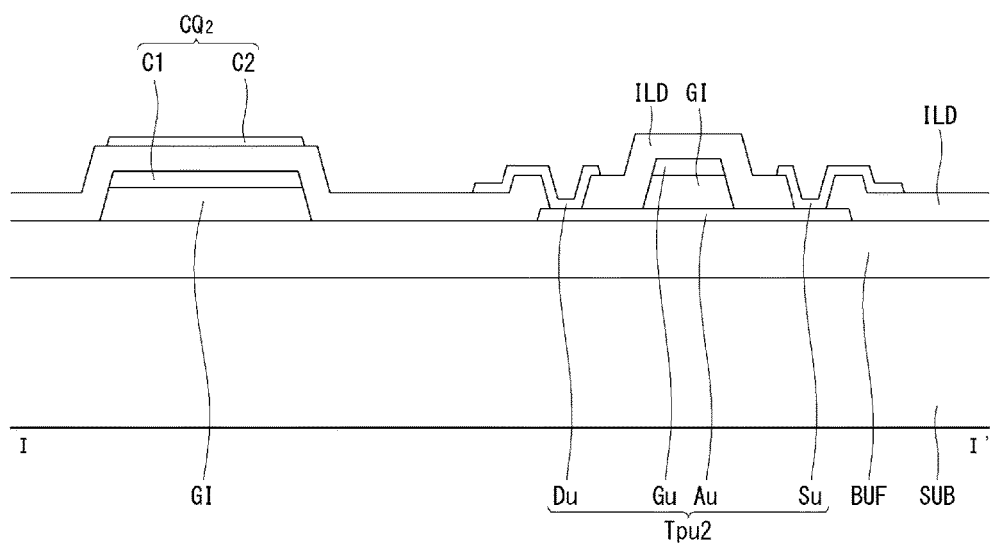
FIG. 8 is a cross sectional view cutting along to line I-I' in FIG. 7.

Hereinafter, we will explain about the structure of the bezel area in which the GIP elements are directly formed on the substrate according to the second embodiment. FIG. 7 is an enlarged plane view illustrating one portion of the bezel area having the GIP according to the second embodiment of the present disclosure. FIG. 8 is a cross sectional view cutting along to line I-I' in FIG. 7.

FIG. 7 illustrates the structure in the plane view of the circle A portion in FIG. 5. Referring to FIG. 7, the second CQ capacitor CQ2 is connected between the second pull-up thin film transistor Tpu2 and the second pull-down thin film transistor Tpd2. The second pull-up thin film transistor Tpu2 includes a gate electrode Gu, a source electrode Su and a drain electrode Du, wherein the source electrode Su and the drain electrode Du are disposed at both side of the gate electrode Gu, respectively. The second pull-down thin film transistor Tpd2 includes a gate electrode Gd, a source electrode Sd and a drain electrode Dd, wherein the source electrode Sd and the drain electrode Dd are disposed at both side of the gate electrode Gd, respectively. The source electrode Su of the second pull-up thin film transistor Tpu2 is connected to the drain electrode Dd of the second pull-down thin film transistor Tpd2.

Further, a first capacitance electrode C1 is formed as extended from the gate electrode Gu of the second pull-up thin film transistor and expanded in a rectangular shape. A second capacitance electrode C2 is formed extended from the source electrode Su of the second pull-up thin film transistor Tpu2 and expanded in a rectangular shape. The first capacitance electrode C1 and the second capacitance electrode C2 have the same shape and size and overlapped with each other having a dielectric layer between them. As the results, the second CQ capacitor CQ2 having the first capacitance electrode C1 and the second capacitance electrode C2 is connected between the gate electrode Gu and the source electrode Su of the second pull-up thin film transistor Tpu2.

Further referring to FIG. 8, we will explain about the cross sectional view of the GIP element according to the second embodiment of the present disclosure. Especially, we will explain as focusing on the second pull-up thin film transistor Tpu2 and the second CQ capacitor CQ2.

On the whole surface of the substrate SUB, a buffer layer BUF is deposited and/or coated. On the buffer layer BUF, a semiconductor layer Au of the second pull-up thin film transistor Tpu2 is formed. Even though not shown in figure, the semiconductor layer of the second pull-down thin film transistor Tpd2 may be formed also. The gate electrode Gu of the second pull-up thin film transistor Tpu2 is formed on the middle portion of the semiconductor layer Au with the gate insulating layer GI there-between. Further, at the area where the second CQ capacitor, the gate insulating layer GI and the first capacitance electrode C1 are formed.

An intermediate insulating layer ILD is deposited and/or coated on the whole surface of the substrate SUB having the gate electrode Gu of the second pull-up thin film transistor Tpu2 and the first capacitance electrode C1. The intermediate insulating layer ILD has the contact holes for exposing one portion and the other portion of the semiconductor layer Au of the second pull-up thin film transistor Tpu2. The portions of the semiconductor layer Au of the second pull-up thin film transistor Tpu2 overlapping with the gate electrode Gu is defined as the channel area. Further, the one portion and the other portion exposed by the contact holes are defined as the drain area and the source area, respectively.

On the intermediate insulating layer ILD, the drain electrode Du and the source electrode Su of the second pull-up thin film transistor Tpu2 and the second capacitance electrode C2. The drain electrode Du contacts the one portion of the semiconductor layer Au through the one contact hole. The source electrode Su contacts the other portion of the semiconductor layer Au through another contact hole. As overlapping with the first capacitance electrode C1 having the intermediate insulating layer ILD there-between, the first capacitance electrode C1 and the second capacitance electrode C2 form the second CQ capacitor CQ2.

The first CQ capacitor CQ1 and the second CQ capacitor CQ2 are for coupling to the first output node No1 and the second output node No2 having a higher level than the low level voltage VSS, when the bootstrapping is conducted. Especially, it is required that the second CQ capacitor CQ2 has enough capacitance values. Therefore, it is preferable that the size of the second CQ capacitor CQ2 has large area enough to ensuring the capacitance values. As the results, as shown in FIG. 7, a predetermined width $W_{BZ}$ for the second CQ capacitor CQ2 would be ensured in the whole of the bezel area.

Third Embodiment

Hereinafter, referring to FIGS. 9 and 10, we will explain about the third embodiment of the present disclosure. In the first and the second embodiments, we explained about the GIP elements in the viewpoint of the circuit configuration. Here, we will explain about the structure in which the bezel area is more reduced when circuits for the GIP element is configured and/or formed on the substrate directly. Further, the third embodiment provides a structure having more reduced bezel area than the second embodiment. However, the feature of the third embodiment is not restricted to the second embodiment only, but it is applied to the first embodiment. Further, in the above embodiments, the GIP elements are divided into the odd GIP and the even GIP, and disposed at the left side and the right side of the substrate. However, the features of the third embodiment may be applied to the structure in which GIP elements are disposed at any one side of the display substrate, for reducing the bezel area.

Figure 9:
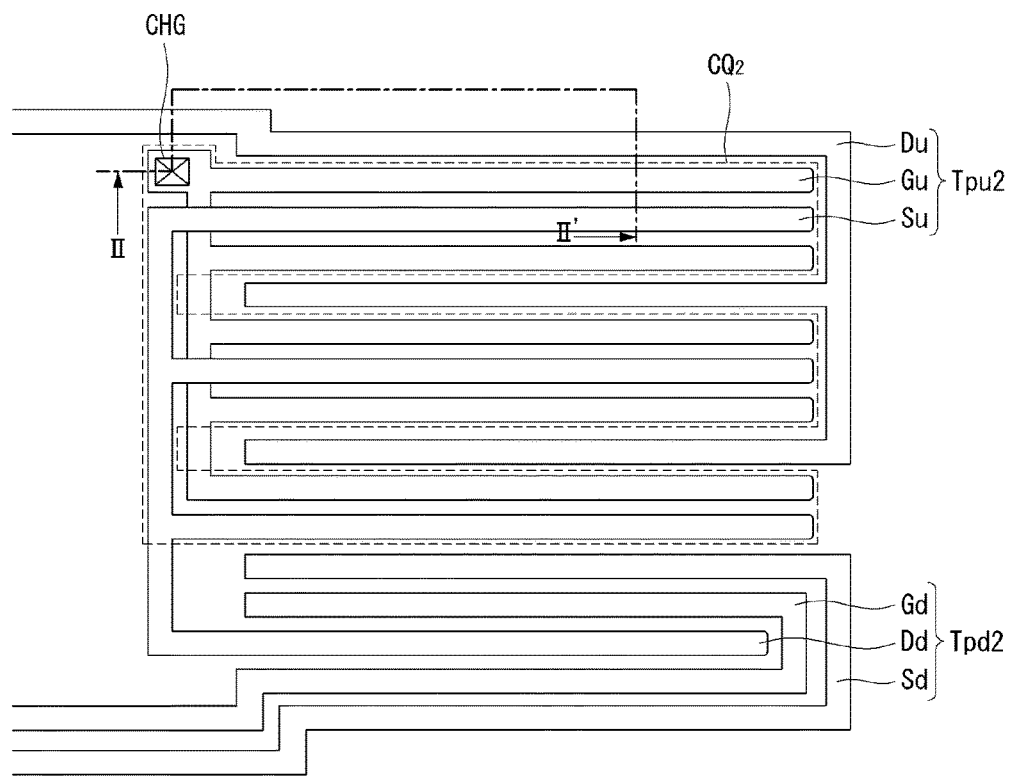
FIG. 9 is an enlarged plane view illustrating one portion of the bezel area having the GIP elements according to the third embodiment of the present disclosure.

FIG. 9 is an enlarged plane view illustrating one portion of the bezel area having the GIP elements according to the third embodiment of the present disclosure. FIG. 10 is a cross sectional view cutting along to line II-II' in FIG. 9.

Referring to FIG. 9, the second pull-up thin film transistor Tpu2 and the second pull-down thin film transistor Tpd2 are disposed in the bezel area. The second pull-up thin film transistor Tpu2 includes a gate electrode Gu, a drain electrode Du and a source electrode Su, wherein the drain electrode Du and the source electrode Su are disposed at both side of the gate electrode Gu, respectively. The second pull-down thin film transistor Tpd2 includes a gate electrode Gd, a drain electrode Dd and a source electrode Sd, wherein the drain electrode Dd and the source electrode Sd are disposed at both side of the gate electrode Gd, respectively. The source electrode Su of the second pull-up thin film transistor Tpu2 is connected to the drain electrode Dd of the second pull-down thin film transistor Tpd2.

Unlike the GIP element according to the second embodiment, the GIP element according to the third embodiment, the second CQ capacitor CQ2 is not directly shown in the plane view of the GIP element according to the third embodiment. In the GIP structure according to the third embodiment, the second CQ capacitor CQ2 is vertically stacked with the second pull-up thin film transistor Tpu2.

Under the semiconductor layer, a light shielding layer LS is disposed as overlapping with the gate electrode Gu and the source electrode Su of the second pull-up thin film transistor Tpu2. The light shielding layer LS is connected to the gate electrode Gu of the second pull-up thin film transistor Tpu2 via the gate contact hole CHG. As the results, the light shielding layer LS would be the first capacitance electrode C1, and the source electrode Su would be the second capacitance electrode C2. That is, the second CQ capacitor CQ2 is formed between the light shielding layer LS connected to the gate electrode Gu of the second pull-up thin film transistor Tpu2 and the source electrode Su. In the third embodiment, the capacitance electrodes for the second CQ capacitor CQ2 are not formed separately. The light shielding layer LS and the source electrode Su of the second pull-up thin film transistor Tpu2 are used for the capacitance electrodes for the second CQ capacitor CQ2.

Figure 10:
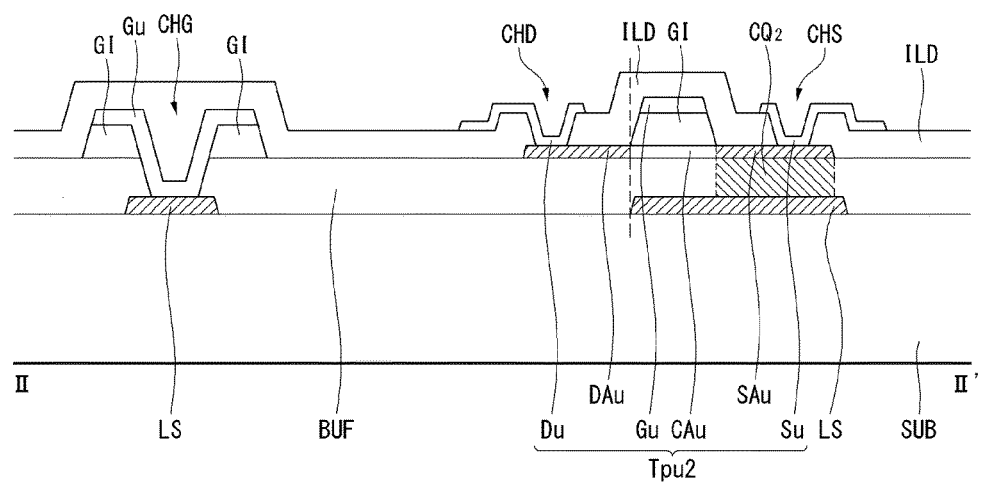
FIG. 10 is a cross sectional view cutting along to line II-II' in FIG. 9.

Further referring to FIG. 10, we will explain about the cross sectional structure of the GIP element according to the third embodiment. Especially, we will explain focusing on the second pull-up thin film transistor Tpu2 and the second CQ capacitor CQ2.

The light shielding layer LS is formed on the top surface of the substrate SUB. The light shielding layer LS is for protecting the channel areas of the second pull-up thin film transistor Tpu2 and the second pull-down thin film transistor Tpd2 from the lights intruding from the external environment. In the third embodiment, the light shielding layer LS is also for forming the second CQ capacitor CQ2. Therefore, it is preferable that the light shielding layer LS is overlapped with the source area and the channel area of the semiconductor layer of the second pull-up thin film transistor Tpu2, but is not overlapped with the drain area.

If the light shielding layer LS is overlapped with the drain area of the semiconductor layer Au of the second pull-up thin film transistor Tpu2, it is not guarantee the normal operation of the second CQ capacitor CQ2 due to the parasitic capacitance formed between the drain area and the light shielding layer LS. Further, as the light shielding layer LS is for protecting the channel area from the external lights, it is preferable that the channel area is fully covered by the light shielding layer LS.

A buffer layer BUF is deposited and/or coated on the whole surface of the substrate SUB having the light shielding layer LS. On the buffer layer BUF, a semiconductor layer Au of the second pull-up thin film transistor Tpu2 is formed. Even though it is not shown in figure, the semiconductor layer of the second pull-down thin film transistor Tpd2 may be formed. On the middle portion of the semiconductor layer Au, a gate electrode Gu of the second pull-up thin film transistor Tpu2 is formed with a gate insulating layer GI between the semiconductor layer Au and the gate electrode Gu.

The light shielding layer LS is connected to the gate electrode Gu of the second pull-up thin film transistor Tpu2. To do so, some portions of the light shielding layer LS is directly contacted the gate electrode Gu via the gate contact hole CHG. The gate contact hole CHG exposes some portions of the light shielding layer LS by penetrating the gate insulating layer GI and the buffer layer BUF.

An intermediate insulating layer ILD is deposited and/or coated on the whole surface of the substrate SUB having the gate electrode Gu of the second pull-up thin film transistor Tpu2. The intermediate insulating layer ILD includes a drain contact hole CHD and a source contact hole CHS are formed as exposing one portion and another portion of the semiconductor layer Au of the second pull-up thin film transistor Tpu2, respectively. The portion of the semiconductor layer Au of the second pull-up thin film transistor Tpu2 overlapped with the gate electrode Gu is defined as the channel area CAu. Further, both side portions from the channel area CAu are defined as a drain area DAu and a source area SAu, respectively. The second CQ capacitor CQ2 is formed at some of the buffer layer BUF disposed between the light shielding layer LS and the source area SAu of the second pull-up thin film transistor Tpu2.

On the intermediate insulating layer ILD, a drain electrode Du and the source electrode Su of the second pull-up thin film transistor Tpu2 are formed. The drain electrode Du contacts the drain area DAu via the drain contact hole CHD. The source electrode Su contacts the source area SAu via the source contact hole CHS.

By comparing with the GIP structure of the second embodiment, the GIP element according to the third embodiment has the second CQ capacitor CQ2 formed as stacking under the second pull-up thin film transistor Tpu2 instead of the separately formed capacitance electrodes. Therefore, a predetermined width WBZ of the bezel area for the second CQ capacitor CQ2 according to the second embodiment is not required in the GIP element according to the third embodiment. That is, the GIP element according to the third embodiment has the much narrowed bezel structure.

The GIP element has the structure in which the GIP element outputs two gate output signals having different phases each other using two pull-up thin film transistors connected to the Q node, so that the number of the GIP element can be half of that of the related art. The GIP type gate driver according to the present disclosure has the narrow bezel structure in which the bezel areas disposed at left and right sides of the substrate can be reduced by reducing the number of the GIP elements for driving the gate lines. As the results, the bezel area BZ including GIP elements can be reduced.

Further, the GIP type gate driver has the structure in which any one gate output signal of the former GIP element is used for the start signal at the forward shifting mode and the reverse shifting mode. Therefore, the circuit configuration of the GIP element could be simplified so that the bezel area BZ can be further reduced.

In addition, the GIP type gate driver according to the present disclosure has the structure in which the capacitor for boosting is stacked under the thin film transistor. As the results, the bezel area BZ including GIP elements can be minimized.

Figure 11:
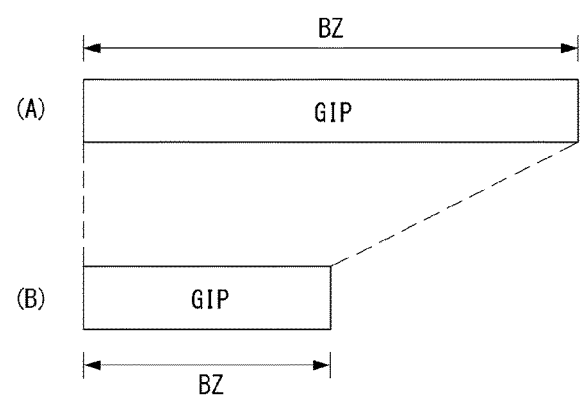
FIG. 11 is a schematic diagram illustrating the reduction of the bezel area of the display, comparing with the related art, as applying the GIP type gate driver according to the present disclosure.

FIG. 11 is a schematic diagram illustrating the reduction of the bezel area of the display, comparing with the related art, as applying the GIP type gate driver according to the present disclosure. For the related art, as shown in FIG. 11(A), it is very hard to reduce the bezel area BZ for disposing the GIP elements. For the present disclosure, as shown in FIG. 11(B), the bezel area BZ for the GIP elements can be remarkably reduced than the related art.

It will be apparent to those skilled in the art that various modifications and variations can be made in the display having a narrow bezel of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flat panel display, comprising:
   a substrate including a display area and a non-display area;
   a pull-up thin film transistor including a first gate electrode, a first source electrode and a first drain electrode, disposed in the non-display area; and
   a boosting capacitor disposed between the first gate electrode and the first source electrode;
   wherein the boosting capacitor includes a light shielding layer connected to the first gate electrode and overlapping with the first source electrode, but not overlapping with the first drain electrode.

2. The device according to the claim 1, further comprising:
   a buffer layer covering the light shielding layer; and
   a semiconductor layer including a channel area, a source area and a drain area,
   wherein the channel area overlaps with the light shielding layer,
   wherein the source area is extended from one side of the channel area and overlapped the light shielding layer,
   wherein the drain area is not overlapped the light shielding layer,
   wherein the first gate electrode is overlapped the channel layer with a gate insulating layer between the first gate electrode and the channel layer, and
   wherein the boosting capacitor is formed at some portions of the buffer layer between the light shielding layer as a first capacitance electrode and the source area as a second capacitance electrode.

3. The device according to the claim 2, further comprising:
   an intermediate insulating layer covering the first gate electrode,
   wherein the first drain electrode is connected to the drain area on the intermediate insulating layer, and
   wherein the first source electrode is connected to the source area on the intermediate insulating layer.

4. The device according to the claim 1, wherein the first gate electrode is connected to the light shielding layer via a gate contact hole penetrating the gate insulating layer and the buffer layer.

5. The device according to the claim 1, further comprising:
   a pull-down thin film transistor including a second gate electrode, a second source electrode and a second drain electrode, in the non-display area,
   wherein the second drain electrode is connected to the first source electrode.

6. A display apparatus, comprising:
   a substrate including a display area and a non-display area;
   a light shielding layer on the substrate in the non-display area; and
   a pull-up thin film transistor in the non-display area and including a semiconductor layer with a channel area, a source area, and a drain area, the source area overlapping with the light shielding layer without the drain area overlapping with the light shielding layer in plan view,
   wherein the light shielding layer forms a first electrode of a boosting capacitor, and the source area of the semiconductor layer forms a second electrode of the boosting capacitor.

7. The display apparatus of claim 6, wherein the pull-up thin film transistor further includes:
   a first gate electrode overlapping with the channel area in plan view, a first source electrode electrically connected to the source area, and a first drain electrode electrically connected to the drain area.

8. The display apparatus of claim 7, wherein the first source electrode overlaps with the light shielding layer without the first drain electrode overlapping with the light shielding layer in plan view.

9. The display apparatus of claim 7, further comprising:
an intermediate insulating layer over the first gate electrode,
wherein the first drain electrode is over the intermediate insulating layer and is electrically connected to the drain area via a drain contact hole through the intermediate insulating layer, and
wherein the first source electrode is over the intermediate insulating layer and is electrically connected to the source area via a source contact hole through the intermediate insulating layer.

10. The device according to the claim 7, further comprising:
a buffer layer between the light shielding layer and the semiconductor layer; and
a gate insulating layer between the semiconductor layer and the first gate electrode,
wherein the first gate electrode is electrically connected to the light shielding layer via a gate contact hole through the gate insulating layer and the buffer layer.

11. The display apparatus of claim 6, wherein the channel area overlaps with the light shielding layer in plan view.

12. The display apparatus of claim 6, further comprising:
a buffer layer between the light shielding layer and the semiconductor layer,
wherein the boosting capacitor is formed at a portion of the buffer layer between the light shielding layer as the first electrode of the boosting capacitor and the source area of the semiconductor layer as the second electrode of the boosting capacitor.

13. The display apparatus of claim 6, further comprising:
a pull-down thin film transistor in the non-display area and including a second gate electrode, a second source electrode, and a second drain electrode,
wherein the second drain electrode is electrically connected to the first source electrode.

14. A display apparatus, comprising:
a substrate;
a light shielding layer over the substrate;
a semiconductor layer having a channel area, a source area, and a drain area, the source area covering the light shielding layer without the drain area covering the light shielding layer in plan view;
a first gate electrode over the channel area;
a first drain electrode electrically connected with the drain area; and
a first source electrode electrically connected with the source area,
wherein the first gate electrode, first drain electrode, the first source electrode, and the semiconductor layer form a pull-up transistor, and
wherein the light shielding layer and the source area of the semiconductor layer respectively form a first electrode and a second electrode of a boosting capacitor.

15. The display apparatus of claim 14, further comprising:
a buffer layer on the light shielding layer and under the semiconductor layer,
wherein the boosting capacitor is formed at a portion of the buffer layer between the light shielding layer as the first electrode of the boosting capacitor and the source area of the semiconductor layer as the second electrode of the boosting capacitor.

16. The display apparatus of claim 15, further comprising:
a gate insulating layer between the semiconductor layer and the first gate electrode,
wherein the first gate electrode is electrically connected to the light shielding layer via a gate contact hole through the gate insulating layer and the buffer layer.

17. The display apparatus of claim 16, further comprising:
an intermediate insulating layer over the first gate electrode,
wherein the first drain electrode is over the intermediate insulating layer and is electrically connected to the drain area via a drain contact hole through the intermediate insulating layer, and
wherein the first source electrode is over the intermediate insulating layer and is electrically connected to the source area via a source contact hole through the intermediate insulating layer.

18. The display apparatus of claim 14, wherein the channel area covers the light shielding layer in plan view.

19. The display apparatus of claim 14, wherein the pull-up thin film transistor and the boost capacitor are in a non-display area of the substrate.

20. The display apparatus of claim 14, further comprising:
a pull-down thin film transistor in a non-display area of the substrate, and including a second gate electrode, a second source electrode, and a second drain electrode,
wherein the second drain electrode is electrically connected to the first source electrode.

* * * * *